(12) United States Patent
Takahashi (10) Patent No.: US 7,864,608 B2
(45) Date of Patent: Jan. 4, 2011

(54) SEMICONDUCTOR DEVICE

(75) Inventor: Hiroyuki Takahashi, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 203 days.

(21) Appl. No.: 12/153,976

(22) Filed: May 28, 2008

(65) Prior Publication Data
US 2008/0298150 A1 Dec. 4, 2008

(30) Foreign Application Priority Data
May 29, 2007 (JP) .............................. 2007-141609

(51) Int. Cl.
*G11C 7/00* (2006.01)
(52) U.S. Cl. .................... 365/207; 365/210.12
(58) Field of Classification Search ............. 365/210.12
See application file for complete search history.

(56) References Cited

U.S. PATENT DOCUMENTS

| | | | |
|---|---|---|---|
| 6,181,626 B1 * | 1/2001 | Brown ..................... | 365/210.1 |
| 6,324,111 B1 * | 11/2001 | Sato et al. ................ | 365/207 |
| 6,392,916 B1 * | 5/2002 | Choi et al. ............... | 365/145 |
| 6,490,214 B2 * | 12/2002 | Kawasumi ............. | 365/210.12 |
| 6,577,548 B1 * | 6/2003 | Barth et al. ............ | 365/210.13 |
| 6,767,269 B1 * | 7/2004 | Liu ........................... | 446/71 |
| 6,987,698 B2 * | 1/2006 | Bando et al. ........... | 365/189.07 |
| 7,038,962 B2 * | 5/2006 | Yamagami .............. | 365/205 |
| 7,460,390 B2 * | 12/2008 | Yamamura .............. | 365/145 |

FOREIGN PATENT DOCUMENTS

| | | |
|---|---|---|
| JP | 11-39875 | 2/1999 |
| JP | 11-121717 | 4/1999 |
| JP | 2000-285676 | 10/2000 |

\* cited by examiner

*Primary Examiner*—Tan T. Nguyen
(74) *Attorney, Agent, or Firm*—McGinn Intellectual Property Law Group, PLLC

(57) ABSTRACT

A semiconductor device includes a DRAM cell configured to store a data; and a sense amplifier activated in response to supply of power supply voltages and configured to sense the data stored in the DRAM cell. A power supply circuit supplies the power supply voltages to the sense amplifier. A sense amplifier dummy circuit provides a replica of a state of the sense amplifier immediately after the activation of the sense amplifier; and a power supply control circuit controls the power supply circuit based on the replica such that the power supply voltages are varied with time.

20 Claims, 9 Drawing Sheets

SEMICONDUCTOR DEVICE

INCORPORATION BY REFERENCE

This patent application is based on Japanese Patent application No. JP 2007-141609. The disclosure thereof is incorporation herein by reference.

BACKGROUND OF THE INVENTION

1. Field of the Invention

The present invention relates to a semiconductor device, and more particularly relates to a semiconductor device having a sense amplifier.

2. Description of Related Art

Figure 1:
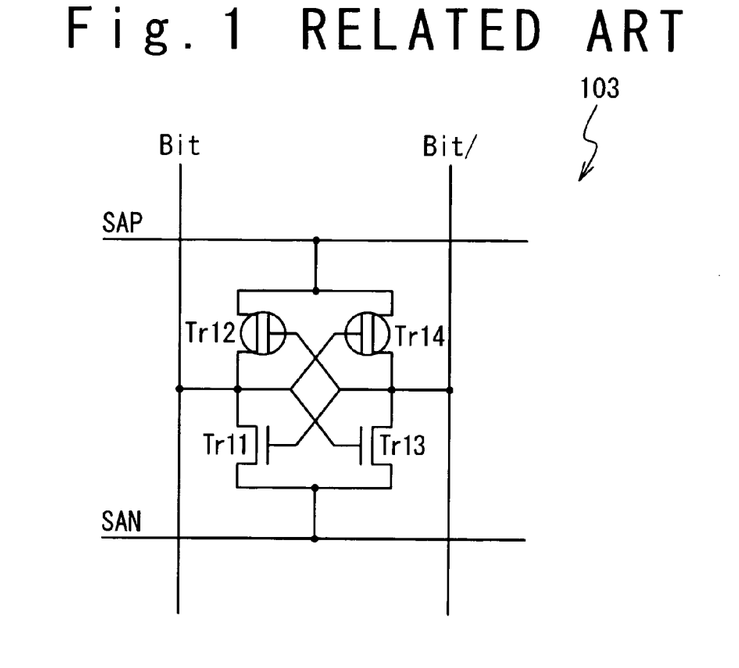
FIG. 1 is a circuit diagram showing a typical configuration of a sense amplifier in DRAM.

A memory such as a DRAM is known which includes an internal power supply of a voltage lower than a voltage of an external power supply and uses the internal power supply as a power supply for a memory cell in accordance with a smaller power consumption and a higher speed operation. FIG. 1 is a circuit diagram showing a typical configuration of a sense amplifier in such a DRAM. The sense amplifier is connected to bit lines Bit and Bit/, and a wiring SAP to supply the voltage of the internal power supply, and a wiring SAN to supply a ground voltage. The power supply voltage of the sense amplifier supplied from the wiring SAP, namely, the voltage of a high level of the bit line Bit (Bit/) is used as the voltage of the internal power supply. Thus, it is possible to suppress the power that is consumed when the bit lines are driven at the time of a read operation.

Figure 2:
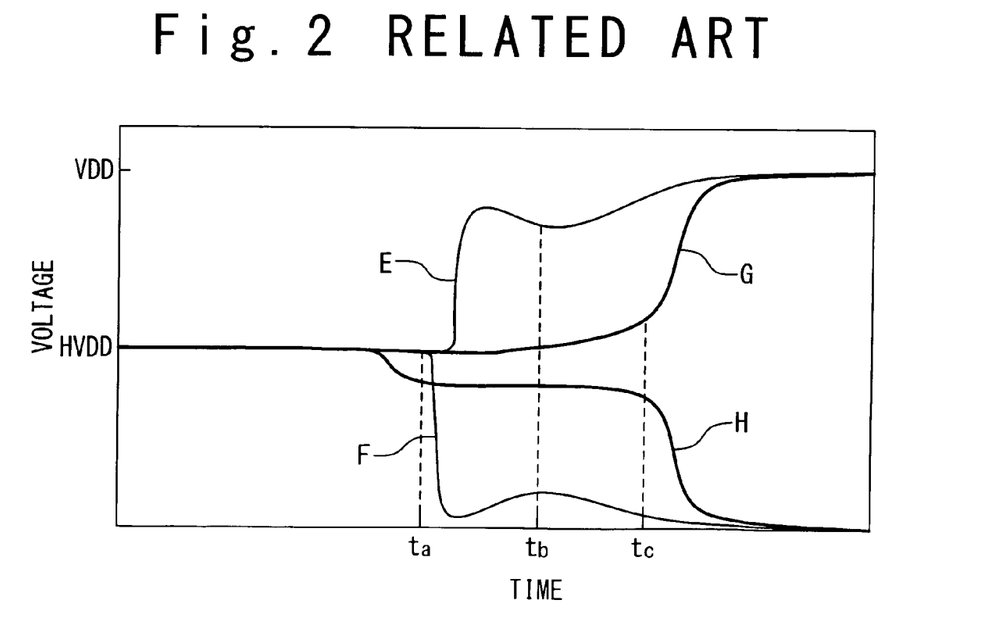
FIG. 2 is a graph showing a time dependence of voltages of PMOS transistor and bit lines in the sense amplifier.

FIG. 2 is a graph showing the time dependences of the voltages of PMOS transistors and the bit lines in the sense amplifier. The vertical axis indicates the drain voltages of the PMOS transistors and the voltage of the bit lines, and the horizontal axis indicates time. Curves E and F indicate the changes in the drain voltages of PMOS transistors Tr12 and Tr14, and curves G and H indicate the changes in the voltages of the bit lines Bit and Bit/.

When a power supply voltage VDD supplied to the sense amplifier is set to a low voltage, a delay is generated in the operation of the sense amplifier. That is, the sense amplifier does not substantially amplify a small voltage difference between the bit lines Bit and Bit/ approximately until a time tc, after its operation is started at a time ta, as shown by the curves G and H. The reason of the delay is in that since the power supply voltage VDD applied to a sense amplifier 103 is not sufficiently high as compared with the total of threshold voltages Vth of the PMOS transistor Tr12 (Tr14) and an NMOS transistor Tr13 (Tr11), the switching performance of the transistor is insufficient, and the voltages of the bit lines Bit and Bit/ cannot be quickly amplified.

Specifically, the source voltage of the PMOS transistor Tr12 (Tr14) rises up immediately after the sense amplifier starts the operation at the time ta (the curve E). However, when the voltage of the bit line Bit (Bit/) is slightly increased (near the time tb, curve G), the driving performance of the power supply voltage VDD is not sufficiently high, and the response is delayed, which temporally reduces the source voltage of the PMOS transistor Tr12 (Tr14) (near the time tb: curve E). As a result, the increase in the voltage of the bit line Bit (Bit/) is becomes slow, and it does not sharply rise up (near the time tb: curve G), which leads to the delay of the sense amplifier. When the voltage difference between the bit lines Bit and Bit/ arrives at a certain value, the amplification feedback in the circuit is rapidly applied, which rapidly increases the voltage difference (near the time tc: curve G).

Thus, when the voltage of this internal power supply is low, the sensibility of the sense amplifier to the increase or decrease of the power supply voltage (source voltage) of the sense amplifier becomes very high. As a result, this has an adverse influence on the high-speed operation of the sense amplifier. An over-drive method is known as a method to improve such a state. By using the over-drive method, a sufficient current supply capability can be attained. Therefore, the decrease in the source voltage of the PMOS transistor Tr12 (Tr14) can be suppressed, which provides the great effect of the higher speed.

As a related art, Japanese Patent Application Publication (JP-P2000-285676A) discloses a memory device having a sense amplifier of an over-drive method. This memory device contains a first power supply; a second power supply for a voltage lower than a voltage of the first power supply; and the sense amplifier that is connected through bit lines to a memory cell and amplifies voltages on the bit lines. The memory device further contains a sense amplifier control circuit that supplies the voltage of the first power supply to the sense amplifier during a first period when the sense amplifier is activated, and then supplies the second power supply voltage during a second period. The sense amplifier control circuit has a monitoring sense amplifier for amplifying a dummy bit line at a timing approximately simultaneous with the activation of the sense amplifier. The sense amplifier control circuit carries out the switching from the first power supply voltage to the second power supply voltage in accordance with the voltage of the dummy bit line, when the sense amplifier is activated.

Japanese Patent Application Publication (JP-A-Heisei, 11-121717) discloses a semiconductor memory device. This semiconductor memory device contains a plurality of unit amplifiers that are selectively made active when a predetermined drive voltage is supplied to a common source line; and a plurality of sense amplifiers which are dispersedly arranged on a semiconductor substrate and each of which has a drive MOSFET that is selectively turned on in response to a predetermined drive control signal and selectively transfers the drive voltage to the common source line. In this semiconductor memory device, a wiring width of the common source line or the gate width or gate length of the drive MOSFET is changed in accordance with the arrangement distance from the supply node of the drive voltage of the sense amplifier.

Japanese Patent Application Publication (JP-A-Heisei, 11-39875) discloses a semiconductor memory device. This semiconductor memory device contains first, second and third voltage supply nodes; a memory cell array; a sense amplifier block; first, second and third wirings; and a sense amplifier drive control section. A first voltage, a second voltage higher than the first voltage, and a third voltage higher than the second voltage are supplied from the first, second and third voltage supply nodes. In the memory cell array, a memory cell is arranged at a intersection point between a word line and a bit line pair to hold charges corresponding to the first or second voltage as a data. The sense amplifier block includes a sense amplifier, which is connected to the bit line pair and operates in response to the first and third voltages during a first period when the data held in the memory cell is read and operates in response to the first and second voltages during a second period. The first, second and third wirings are connected to the voltage supply nodes and supply the first voltage, the second voltage and the third voltage to the sense amplifier block, respectively. The sense amplifier drive control section adjusts the lengths of the first and second periods in accordance with the wiring lengths between the voltage supply nodes of the wirings and the sense amplifier block.

Figure 3:
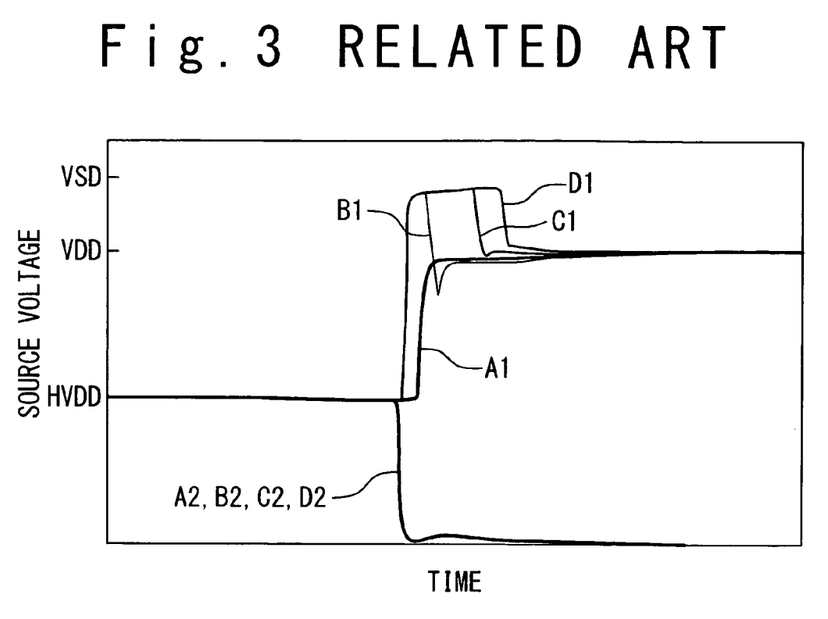
FIG. 3 is a graph showing a time dependence of voltages of a source voltage of a PMOS transistor in a sense amplifier of an over-drive method.
Figure 4:
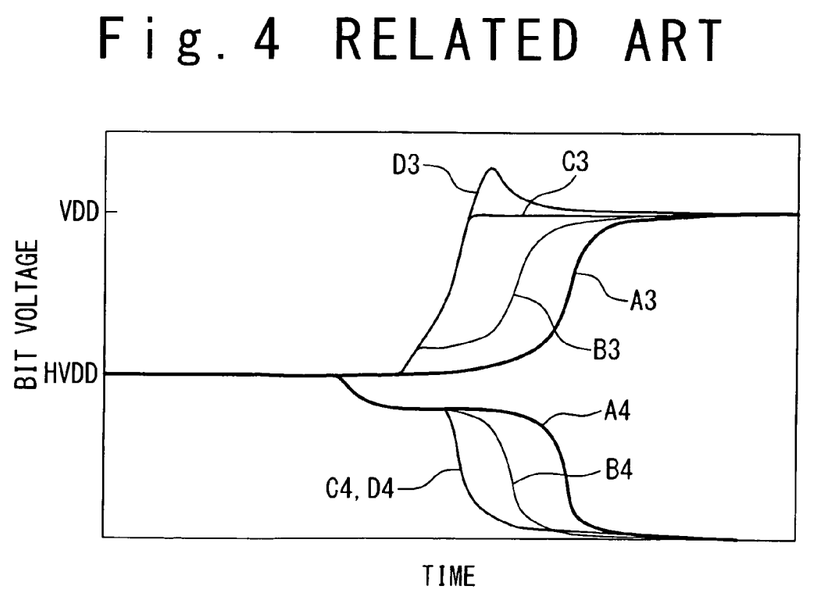
FIG. 4 is a graph showing a time dependence of a voltage of a bit line in the sense amplifier of the over-drive method.

FIG. 3 is a graph showing time dependence of the drain voltages of the PMOS transistors in the sense amplifier of the over-drive method. This is based on a simulation. The vertical axis indicates the drain voltages of the PMOS transistors Tr12 and Tr14, and the horizontal axis indicates time. Curves A1 and A2, B1 and B2, C1 and C2, and D1 and D2 indicate cases of no over-drive execution, tA-time over-drive execution, a tB-time over-drive execution and a tC-time over-drive execution (tA<tB<tC), respectively. Also, FIG. 4 is a graph showing time dependence of the voltages of the bit lines in the sense amplifier of the over-drive method. This is based on a simulation. The vertical axis indicates the voltages of the bit lines Bit and Bit/, and the horizontal axis indicates time. Curves A3 and A4, B3 and B4, C3 and C4, and D3 and D4 indicate cases of no over-drive execution, tA-time over-drive execution, tB-time over-drive execution and tC-time over-drive execution (tA<tB<tC), respectively.

As shown in FIG. 4, the optimal execution time of the over-drive is the tC time (the curves C1 to C4). When the over-drive is excessive so that the source voltage is over-shot (the curve D1), the bit line voltage is also over-shot (the curve D3), so that there is a possibility that the high level of the bit line Bit (Bit/) is higher than the power supply voltage VDD. In that case, when the bit lines Bit and Bit/ are shorted after the read operation, the voltages of the bit lines Bit and Bit/ become higher than (½)VDD, so that pre-charge to (½)VDD cannot be attained. On the contrary, when the over-drive is lack (the curves B1, B3), the operation speed of the sense amplifier is made slow. Thus, the over-drive is required to be controlled.

With regard to it, the inventor of the present invention newly discovered the following technical aspects. In particular, as mentioned above, when the power supply voltage VDD is a low voltage, the sensibility of the sense amplifier to the source voltage of the PMOS transistor is very high, so that the optimal timing range is very narrow. In such a case, it is also important to consider any influence caused by the variations in element performances associated with the manufacture variations in elements such as transistors and the like. Here, the above Japanese Patent Application Publication (JP-P2000-285676A) discloses an over-drive sense amplifier control circuit for carrying out the timing control of the over-drive operation to the sense amplifier. However, only one over-drive sense amplifier control circuit is provided in the entire memory core. Thus, it is difficult to cope with the influence caused by the variations in the element performances. In addition, the over-drive sense amplifier control circuit is complex and occupies a relatively large area. This is because the dummy sense amplifier array is formed from the sense amplifier and circuits around the sense amplifier such as a dummy bit line, and a dummy pre-charging circuit. In other words, it is not practical from view of a chip penalty, and the electric power consumption that a plurality of dummy arrays are arranged in the memory core. Therefore, a technique is demanded which can control the over-drive at a high precision for each sense amplifier. Also, a technique is demanded which can control the over-drive at a high precision for the variation in element performances.

SUMMARY

In an aspect of the present invention, a semiconductor device includes a DRAM cell configured to store a data; and a sense amplifier activated in response to supply of power supply voltages and configured to sense the data stored in the DRAM cell. A power supply circuit supplies the power supply voltages to the sense amplifier. A sense amplifier dummy circuit provides a replica of a state of the sense amplifier immediately after the activation of the sense amplifier; and a power supply control circuit controls the power supply circuit based on the replica such that the power supply voltages are varied with time.

In another aspect of the present invention, a semiconductor device includes a DRAM cell configured to store a data; a sense amplifier configured to sense the data read from the DRAM cell, first and second power supply lines connected to the sense amplifier; and a switch circuit. A logic circuit controls the switch circuit to supply the first power supply line with one of a first voltage and a second voltage which is higher than the first voltage; and a sense amplifier dummy circuit is directly connected with the second power supply line and controls the logic circuit.

In a still another aspect of the present invention, a semiconductor device includes a DRAM cell configured to store a data; bit lines connected with the DRAM cell; a sense amplifier circuit activated in response to supply of power supply voltages and configured to amplify a voltage difference on the bit lines generated based on the data read from the DRAM cell; and first and second power supply lines connected to the sense amplifier circuit. A power supply circuit supplies the power supply voltages onto the first and second power supply lines. A sense amplifier dummy circuit provides a replica of a state of the sense amplifier circuit immediately after the activation of the sense amplifier circuit; and a power supply control circuit controls the power supply circuit based on the replica.

According to the present invention, it is possible to control the over-drive in a high precision for each sense amplifier and also control the over-drive in the high precision in correspondence to variations in the element performances.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor device of the present invention will be described in detail with reference to the attached drawings.

In the present invention, an over-drive method is used for a sense amplifier. Here, the conventional over-drive method had compensated a lack of current supply capability to bit lines Bit and Bit/. However, the following points were made clear through research by the inventor of the present invention.

Irrespectively of the length of the bit lines Bit and Bit/, when the power supply voltage of a sense amplifier 3 is low, it is sometimes difficult to amplify a voltage difference between the bit lines Bit and Bit/ in a high speed. The reason is not in the current supply capability, but is in a lack of the capability to switch the PMOS transistor and NMOS transistor in the sense amplifier. In order to cope with it, not only the conventional method of over-driving the PMOS transistor in the sense amplifier, but also at least one of a method of over-driving the NMOS transistor to the side of a negative voltage and a method of over-driving the PMOS transistor to the side of a positive voltage are desirably performed. Consequently, at least one of the transistors in the sense amplifier 3 is over-driven, and the amplification feedback in the circuit is rapidly applied, which can increase the voltage difference between the bit lines Bit and Bit/. That is, the sense amplifier 3 can be operated at the high speed.

First Embodiment

In this embodiment, the PMOS transistor of the sense amplifier is over-driven to the side of the positive voltage.

Figure 5:
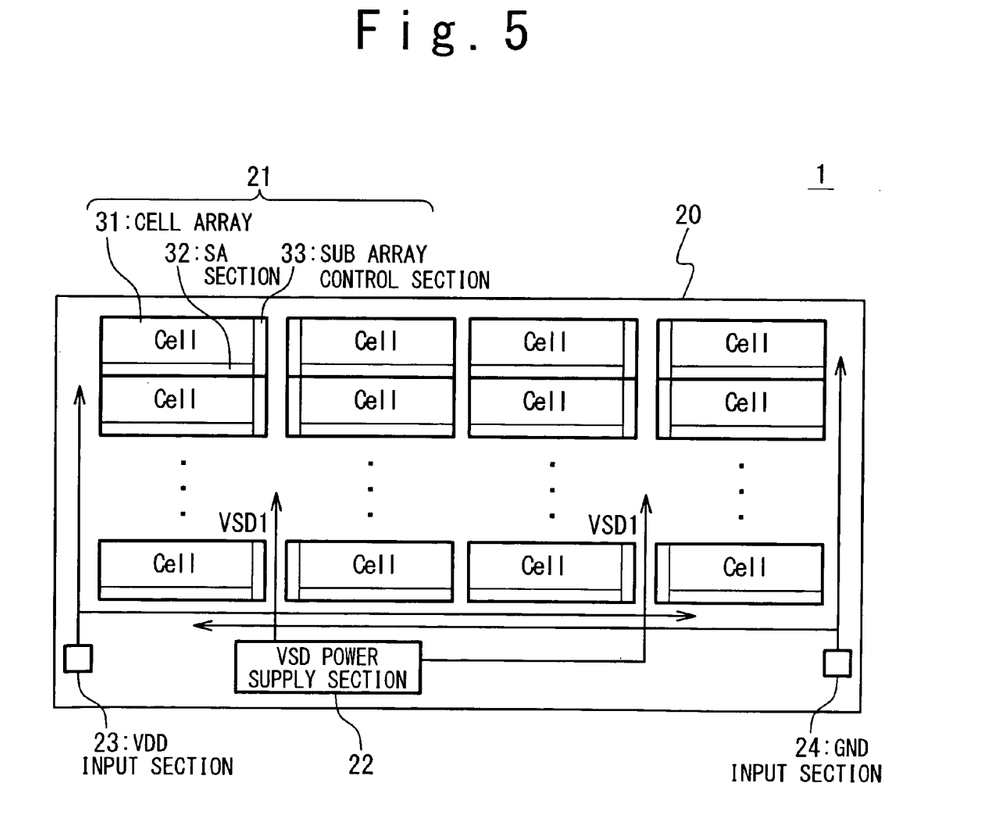
FIG. 5 is a block diagram showing a first embodiment of a semiconductor device of the present invention.

FIG. 5 is a block diagram showing the configuration of the semiconductor device according to the first embodiment of the present invention. A semiconductor device 1 contains a memory core 20. Here, the semiconductor device 1 is necessary to have the memory core 20, and may be a semiconductor memory such as a DRAM or may be a system LSI having the memory core. The memory core 20 has a function of a memory, and is exemplified as a DRAM core. However, if a read operation is carried out in which the sense amplifier is used, the present invention is not limited to the DRAM core. The memory core 20 contains a plurality of sub array cores 21, a VSD power supply section 22, a VDD input section 23 and a GND input section 24.

The plurality of sub array cores 21 are arranged in a matrix in the memory core 20. The sub array core 21 is the minimal unit of the memory array in the memory core 20. The circuits such as a power supply circuit 4, a power supply control circuit 5 and a sense amplifier dummy circuit 6, for controlling the over-drive of the sense amplifier, which will be described later, are preferred to be provided for every minimal unit. However, if the circuit is constituted in the unit that can attain a higher speed of amplification by the sense amplifier and does not carry out the excessive amplification, the circuits may be provided for each unit greater than the sub array core 21, for example, for every two or more of sub array cores 21. The sub array core 21 includes a cell array 31, a sense amplifier (SA) section 32 and a sub array control section 33.

The cell array 31 has a plurality of memory cells arranged in a matrix. If the memory core 20 is the DRAM core, the memory cell is a memory cell for the DRAM. The sense amplifier section 32 has a plurality of sense amplifiers. One sense amplifier is provided for each bit line pair in the cell array 31. The sub array control section 33 controls the operation of the sub array core 21. The sub array control section 33 includes circuits such as the power supply circuit 4, the power supply control circuit 5 and the sense amplifier dummy circuit 6, for controlling the over-drive, which will be described later.

The VDD input section 23 receives the power supply voltage VDD from the outside of the memory core 20 to supply to the respective sub array cores 21. The GND input section 24 receives the ground voltage GND from the outside of the memory core 20 to supply to the respective sub array cores 21. The VSD power supply section 22 uses the power supply voltage VDD and the ground voltage GND and generates a power supply voltage VSD1 for the over-drive, which is higher than the power supply voltage VDD. The VSD power supply section 22 supplies the power supply voltage VSD1 to the respective sub array cores 21.

Figure 6:
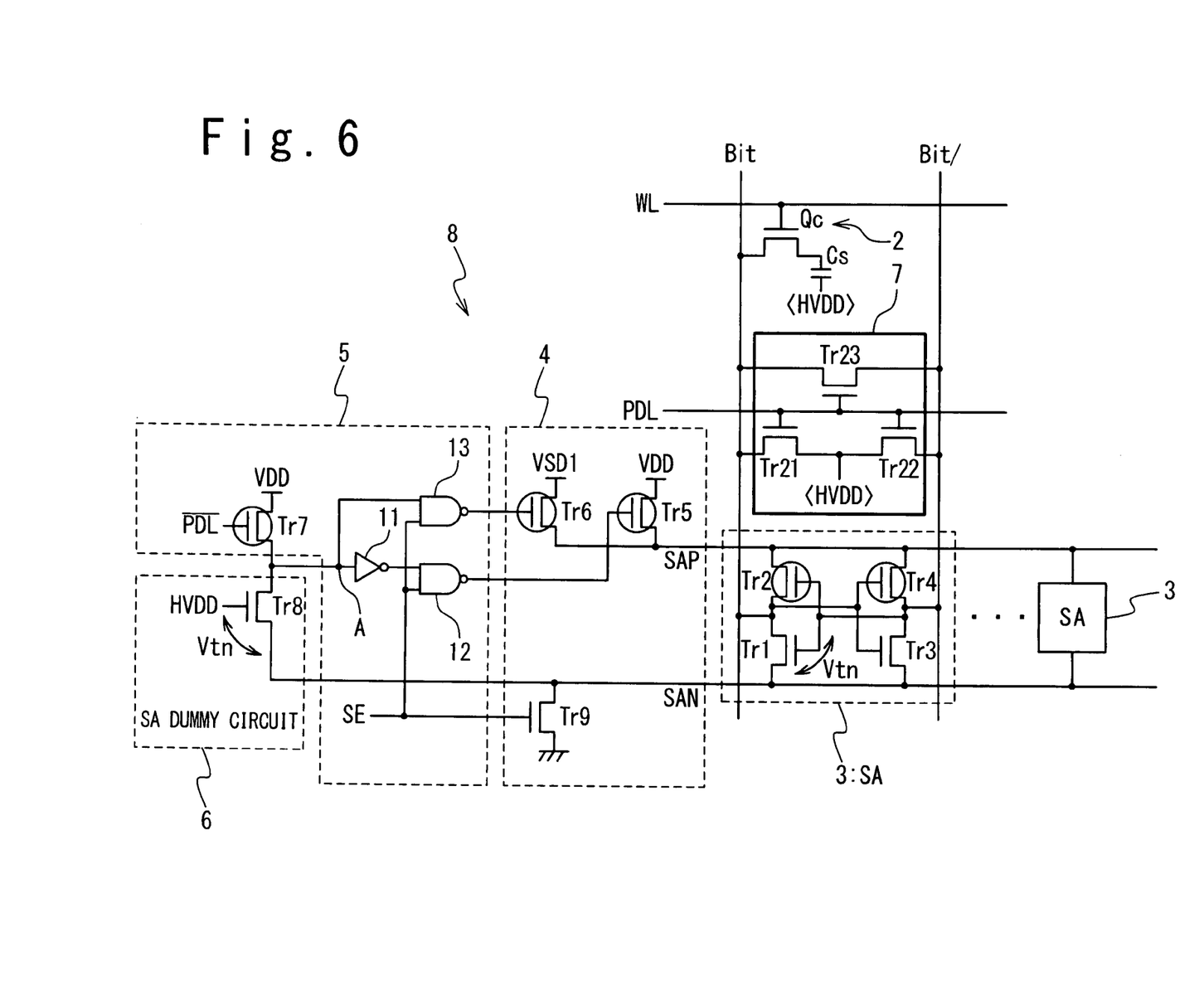
FIG. 6 is one example of a circuit diagram indicating the details of a sense amplifier of a sub array core in the first embodiment of the semiconductor device of the present invention and the circuits with regard to it.

FIG. 6 is a circuit diagram showing the sense amplifier of the sub array core 21 in the semiconductor device according to the first embodiment of the present invention and a peripheral circuit relating to it.

The cell array 31 contains the bit lines Bit and Bit/, a word line WL, a memory cell 2, a pre-charge line PDL, a pre-charging circuit 7. The bit lines Bit and Bit/ extend in a Y-direction, and the word line WL extends in an X-direction orthogonal to the Y-direction. The memory cell 2 is provided at an intersection point between the bit lines Bit and Bit/ and the word line WL. The memory cell 2 includes a selection transistor Qc and a cell capacitor Cs. The cell capacitor Cs accumulates charges. One end of the cell capacitor Cs is connected to a wiring to supply a reference voltage HVDD (for example, 0.4 V), and the other thereof is connected to the selection transistor Qc. The selection transistor Qc is exemplified by the NMOS transistor, and its gate is connected to the word line WL, and one of the source/drain is connected to the bit line Bit, and the other is connected to the cell capacitor Cs.

The pre-charge line PDL extends in the X-direction and is connected to the pre-charging circuit 7.

The pre-charging circuit 7 is provided between the bit lines Bit and Bit/ for each set of the bit lines Bit and Bit/. The pre-charging circuit 7 contains transistors Tr21 to Tr23 (for example, the NMOS transistors). The transistors Tr21 and Tr22 are connected in series, and their gates are connected to the pre-charge line PDL. One of the source/drain of the Tr21 is connected to the bit line Bit, one of the source/drain of the Tr22 is connected to the bit line Bit/, and a connection point of the transistors Tr21 and Tr22 is connected to the wiring to supply the reference voltage HVDD (for example, 0.4 V). In the transistor Tr23, its gate is connected to the pre-charge line PDL, and its source/drain are connected to the bit lines Bit and Bit/, respectively. The pre-charging circuit 7 pre-charges one set of the bit lines Bit and Bit/ to the reference voltage HVDD in the wait state of the memory cell 2. The reference voltage HVDD is set to ½ of the power supply voltage VDD.

The sense amplifier section 32 includes the sense amplifier 3 between the bit lines Bit and Bit/, for each set of the bit lines Bit and Bit/. The sense amplifier 3 is connected to sense amplifier power supply lines SAP and SAN, and the bit lines Bit and Bit/. The sense amplifier 3 detects and amplifies the voltage difference between the bit lines Bit and Bit/ of one set in the read operation from the memory cell 2. The data of the memory cell 2 is read out based on the amplified voltage difference.

The sense amplifier 3 contains transistors Tr1 to Tr4. The power supply voltage VDD (for example, 0.8 V) on the highpotential side is supplied through the sense amplifier power supply line SAP to the sources of the transistors Tr2 (for example, the PMOS transistor) and Tr4 (for example, the PMOS transistor). However, at the time of the over-drive, the power supply voltage VSD1 (for example, 1.0 V) is supplied. Also, the ground voltage GND (for example, 0 V) on the low-potential side is supplied through the sense amplifier power supply line SAN to the sources of the transistor Tr1 (for example, the NMOS transistor) and Tr3 (for example, the NMOS transistor). The transistors Tr1 and Tr2 are connected in series, and their gates are connected to the Bit/ and the connection point of the transistors Tr3 and Tr4. The transistors Tr3 and Tr4 are connected in series, and their gates are connected to the Bit and the connection point of the transistors Tr1 and Tr2.

The sub array control section 33 contains a word line driving circuit (not shown) for driving the word line WL; a bit line pre-charge driving circuit (not shown) for driving the pre-charge line PDL; and a sense amplifier driving circuit 8 for driving the sense amplifier power supply lines SAP and SAN. The sense amplifier driving circuit 8 supplies the power supply voltages VDD and VSD1 through the sense amplifier power supply line SAP and supplies the ground voltage GND through the sense amplifier power supply line SAN and controls the read operation based on the over-drive method of the sense amplifier. The sense amplifier driving circuit 8 contains the power supply circuit 4, the power supply control circuit 5 as a logic circuit and the sense amplifier dummy circuit 6.

The power supply circuit 4 supplies the power supply voltage VSD1 (for example, 1.0 V) for the over-drive to the sense amplifier power supply line SAP in the read operation in response to a control signal from the power supply control circuit 5, and then the usual power supply voltage VDD (for example, 0.8 V) to the sense amplifier power supply line SAP. That is, the power supply voltage is switched and supplied. Simultaneously, the power supply circuit 4 supplies the ground voltage GND (for example, 0 V) to the sense amplifier power supply line SAN.

The power supply circuit 4 contains PMOS transistors Tr5 and Tr6 and an NMOS transistor Tr9. In the PMOS transistor Tr5, its source is connected to the wiring to supply the power supply voltage VDD, its gate is connected to a NAND circuit 12 in the power supply control circuit 5, and its drain is connected to the sense amplifier power supply line SAP. In the PMOS transistor Tr6, its source is connected to the wiring to supply the power supply voltage VSD1, its gate is connected to a NAND circuit 13 in the power supply control circuit 5, and its drain is connected to the sense amplifier power supply line SAP, respectively. In the NMOS transistor Tr9, its source is connected to the wiring to supply the ground voltage GND, its gate is connected to the wiring to supply a sense amplifier enable signal SE from the power supply control circuit 5, and its drain is connected to the sense amplifier power supply line SAN.

The power supply control circuit 5 controls the power supply circuit 4 in accordance with the output of the sense amplifier dummy circuit 6. In this example, the power supply control circuit 5 contains a PMOS transistor Tr7, an inverter circuit 11 and the NAND circuits 12 and 13. In the PMOS transistor Tr7, its source is connected to the wiring to supply the power supply voltage VDD, its gate is connected to the wiring to supply a signal PDL/ in which the pre-charge line PDL is inverted, and its drain is connected to the input of the inverter circuit 11, one input of the NAND circuit 13, and the sense amplifier dummy circuit 6 (the drain of the NMOS transistor Tr8). In the inverter circuit 11, its output is connected to one input of the NAND circuit 12. The other input of the NAND circuit 12 is connected to the wiring to supply the sense amplifier enable signal SE, and its output is connected to the gate of the PMOS transistor Tr5. The other input of the NAND circuit 13 is connected to the wiring to supply the sense amplifier enable signal SE, and its output is connected to the gate of the PMOS transistor Tr6 in the power supply circuit 4.

The sense amplifier dummy circuit 6 uses elements less than the number of elements in the sense amplifier 3, and presents (provides) a replica of a partial state of the sense amplifier 3 immediately after the activation of the sense amplifier 3. Since the sense amplifier dummy circuit 6 is provided extremely close to the sense amplifier 3, the elements of the sense amplifier 3 and the elements of the sense amplifier dummy circuit 6 can be considered to be substantially same in element characteristics. Thus, the sense amplifier dummy circuit 6 can present the state of the sense amplifier 3 without any influence caused by the variation in the element characteristics.

The sense amplifier dummy circuit 6 provides the operation immediately after the activation of the sense amplifier 3, namely, the state change during a predetermined period from the pre-charging of the sense amplifier 3 to the sense completion through the sense start. In order to partially reproduce the operation of the sense amplifier 3, the sense amplifier dummy circuit 6 is constituted from only the elements of the sense amplifier circuit (a part of elements of the sense amplifier), and does not have a peripheral circuit of the sense amplifier such as a dummy pre-charging circuit and dummy bit lines. In this way, the operation reproduced by the sense amplifier dummy circuit 6 is especially limited to an operation immediately after the activation of the sense amplifier 3. Thus, it is possible to omit the elements, the wirings and the like, which are not always required to reproduce the operation. Therefore, the circuit for reproducing the operation of the sense amplifier 3 can be made very small.

In this example, one element of the NMOS transistor Tr8 reproduces the operation immediately after the activation of the sense amplifier 3 that is formed from at least four MOS transistors Tr1 to Tr4. In the NMOS transistor Tr8 in the sense amplifier dummy circuit 6, its source is connected to the sense amplifier power supply line SAN, its gate is connected to the wiring to supply HVDD, and its drain is connected to the PMOS transistor Tr7. In the NMOS transistor Tr8, its source is preferred to be directly connected to the sense amplifier power supply line SAN. This is because the operation immediately after the activation of the sense amplifier 3 can be properly reproduced without any influence caused by the other elements.

The NMOS transistor Tr8 in this sense amplifier dummy circuit 6 corresponds to the NMOS transistor Tr1 (Tr3) in the sense amplifier 3. That is, in the NMOS transistor Tr8, the voltage of the gate is HVDD, and the voltage of the source is the voltage of the sense amplifier power supply line SAN. On the other hand, in the NMOS transistor Tr1 (Tr3), its gate is connected to the bit line Bit/ (Bit) that is pre-charged to the HVDD. Thus, the voltage of the gate is HVDD, and the voltage of the source is the voltage of the sense amplifier power supply line SAN. Hence, the NMOS transistor Tr8 and the NMOS transistor Tr1 (Tr3) are equal in the relation between the source and the drain. Since the operation of the NMOS transistor is mainly managed based on the source-drain voltage, the NMOS transistor Tr8 in the sense amplifier dummy circuit 6 can reproduce the operation immediately after the activation of the NMOS transistor Tr1 (Tr3) in the sense amplifier 3.

As mentioned above, the sense amplifier dummy circuit 6 can reproduce the operation immediately after the activation of the sense amplifier 3. In addition, this NMOS transistor Tr8 is the element of a same design (structure) as the NMOS transistor Tr1 (Tr3), and formed in a location very close to it. Thus, its element characteristics can be considered to be substantially equal. Therefore, the sense amplifier dummy circuit 6 can very accurately reproduce the operation of the sense amplifier 3 without any influence caused by the variation in the element properties.

Figure 7A:
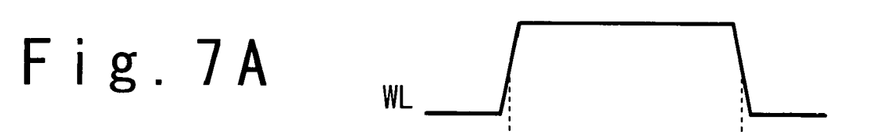
FIGS. 7A to 7H are timing chart showing the operation of the first embodiment in the semiconductor device of the present invention.
Figure 7B:
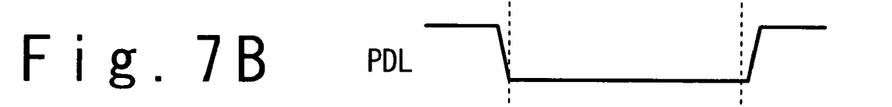
Figure 7C:
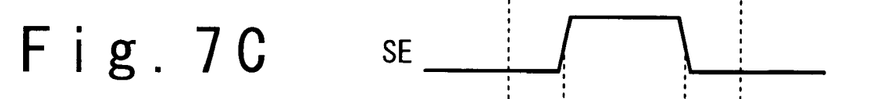
Figure 7D:
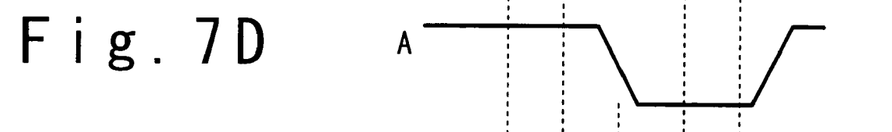
Figure 7E:
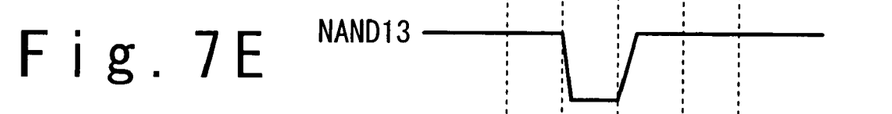
Figure 7F:
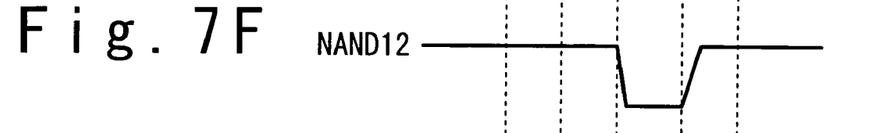
Figure 7G:
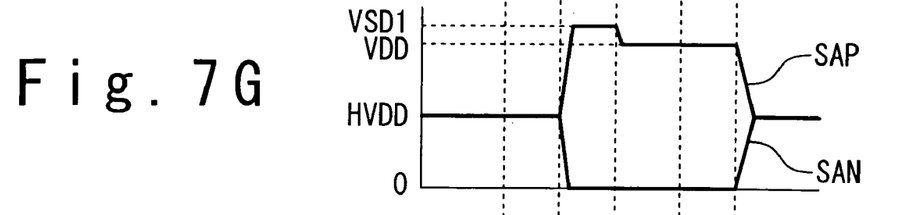
Figure 7H:
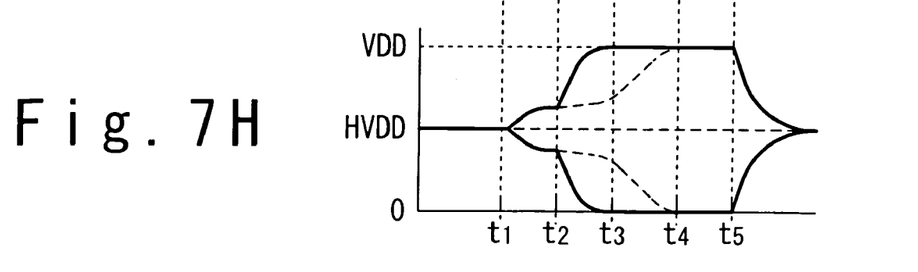

The operation of the semiconductor device in the first embodiment of the present invention will be described below. FIGS. 7A to 7H are timing charts showing the operation of the semiconductor device in the first embodiment of the present invention. Here, 7 6A shows a voltage signal of the word line WL to be boosted up, and FIG. 7B shows a voltage signal of the pre-charge line PDL. FIG. 7C shows the sense amplifier enable signal SE, and FIG. 7D shows a voltage signal of a node A. Here, the node A is the connection point between the drain of the NMOS transistor Tr8 in the sense amplifier dummy circuit 6, the drain of the PMOS transistor Tr7 in the power supply control circuit 5, the input of the inverter circuit 11, and one input of the NAND circuit 13. FIG. 7E shows the output signal of the NAND circuit 13, and FIG. 7F shows the output signal of the NAND circuit 12. FIG. 7G shows voltage signals of the sense amplifier power supply lines SAP and SAN. FIG. 7H shows voltage signals of the bit lines Bit and Bit/.

At a time t1, the voltage of the pre-charge line PDL is set to the low state (FIG. 7B), the word line WL is boosted up (FIG. 7A), and the sensing operation is started. Thus, the voltage difference is generated between the bit lines Bit and Bit/ (FIG. 7H). Here, it is supposed that the higher voltage side is assumed to be the bit line Bit/, and the lower voltage side is assumed to be the bit line Bit. Since the sense amplifier enable signal SE is in the low state (FIG. 7C), the NMOS transistor Tr9 is in the off state. Also, the PMOS transistor Tr7 in the power supply control circuit 5 is turned off, because the pre-charge line PDL is set to the high state. At this time, the voltage of the node A is in the power supply voltage VDD (high state) (FIG. 7D). Thus, since the output of the NAND circuit 13 is in the high state (FIG. 7E), the PMOS transistor Tr6 is in the off state. On the other hand, since the output of the NAND circuit 12 is in the high state (FIG. 7F), the PMOS transistor Tr5 is in the off state. As a result, both of the power supply voltages VSD1 and VDD are not supplied to the sense amplifier power supply line SAP, and the ground voltage GND is not supplied to the sense amplifier power supply line SAN. Therefore, the power supply voltages VSD1 and VDD are in the HVDD state (FIG. 7G)

At a time t2, since the sense amplifier enable signal SE is set to the high state (FIG. 7C), the NMOS transistor Tr9 is turned on. As a result, the ground voltage GND is supplied to the sense amplifier power supply line SAN. Also, the PMOS transistor Tr7 in the power supply control circuit 5 is in the off state. At this time, the voltage of the node A is the power supply voltage VDD (the high state) (FIG. 7D). Thus, since the output of the NAND circuit 13 is set to the low state (FIG. 7E), the PMOS transistor Tr6 is turned on. On the other hand, since the output of the NAND circuit 12 is still in the high state (FIG. 7F), the PMOS transistor Tr5 is still in the off state. As a result, the power supply voltage VSD1 is supplied to the sense amplifier power supply line SAP, and the ground voltage GND is supplied to the sense amplifier power supply line SAN (FIG. 7G).

The power supply voltage VSD1 and the ground voltage GND are supplied to the sense amplifier power supply lines SAP and SAN, respectively. Thus, through the operation of the sense amplifier SA, any one of the bit lines Bit and Bit/ begins to be sharply changed to the high voltage, and the other begins to be sharply changed to the low voltage (FIG. 7H). At this time, at the initial time of the sensing operation, the power supply voltage VSD1 higher than the usual power supply voltage VDD is supplied to the side of the sense amplifier power supply line SAP (it is over-driven). Therefore, as compared with a case of using the usual power supply voltage VDD (FIG. 7H: the dashed lines), the high voltage side (for example, the bit line Bit/) can be made to rise up at the high speed, and the low voltage side (for example, the bit line Bit) can be made to fall down at the high speed.

At a time t3, since the sense amplifier power supply line SAN is already in the ground voltage GND, the voltage difference is generated between the sense amplifier power supply line SAN and the node A. Since the HVDD is supplied to the gate of the NMOS transistor Tr8 in the sense amplifier dummy circuit 6, the charges are moved to the sense amplifier power supply line SAN from the node A. As a result, the voltage of the node A is decreased and is set to the low state (the ground voltage GND) (FIG. 7D).

Similarly, since the sense amplifier power supply line SAN is already in the ground voltage GND, the voltage difference is generated between the sense amplifier power supply line SAN and the drain of the NMOS transistor Tr1. The gate of the NMOS transistor Tr1 in the sense amplifier 3 is already in a voltage higher than the HVDD. Thus, the NMOS transistor Tr1 is turned on, and the charges are moved from its drain to the sense amplifier power supply line SAN. As a result, the voltages of the drain and the bit line Bit are decreased and is set to the ground voltage GND. The timing of the voltage decrease in the NMOS transistor Tr1 corresponds to the timing of the voltage decrease in the NMOS transistor Tr8. That is, the NMOS transistor Tr8 can reproduce the operation immediately after the activation of the NMOS transistor Tr1 (the sense amplifier 3).

As a result, since the output of the NAND circuit 13 is set to the high state (FIG. 7E), the PMOS transistor Tr6 is turned off. On the other hand, since the output of the NAND circuit 12 is set to the low state (FIG. 7F), the PMOS transistor Tr5 is turned on. As a result, the power supply voltage VDD is supplied to the sense amplifier power supply line SAP, and the sense amplifier power supply line SAN is held in the ground voltage GND (FIG. 7G).

The bit line Bit/ is substantially in the VDD of the high voltage, and the bit line Bit is substantially in the GND of the low voltage (FIG. 7H) At this time, the voltage supplied to the sense amplifier power supply line SAP is switched from the power supply voltage VSD1 of the high voltage to the usual power supply voltage VDD. Since this timing is set properly, the source voltage of the PMOS transistor Tr4 in the sense amplifier 3 is never over-shot to the positive side. Thus, the bit line Bit/ does not have a higher voltage above VDD. For this reason, after the sensing operation, the bit lines Bit and Bit/ do not exceed (½)VDD, and the pre-charging operation can be properly performed. That is, the sense amplifier dummy circuit 6 controls the switching circuit to switch the voltage of the sense amplifier power supply line SAP from the power supply voltage VSD1 to the power supply voltage VDD so that the voltage of the bit line Bit/ (the higher voltage side) amplified by the sense amplifier 3 is not higher than the power supply voltage VDD.

After the completion of the read operation in a period between the time t3 and a time t4, the sense amplifier enable signal SE is set to the low state at the time t4 (FIG. 7C). The NMOS transistor Tr9 is turned off. As a result, the ground voltage GND is not supplied to the sense amplifier power supply line SAN. The voltage of the node A is in the low state (the ground voltage GND) (FIG. 7D). Thus, the output of the NAND circuit 13 is still in the high state (FIG. 7E), and the PMOS transistor Tr6 is still in the off state. On the other hand, since the output of the NAND circuit 12 is set to the high state (FIG. 7F), the PMOS transistor Tr5 is turned off. As a result, the power supply voltage VDD and the ground voltage GND are not supplied to the sense amplifier power supply lines SAP and SAN, respectively. However, their voltages are kept (FIG. 7G). Also, the bit line Bit/ is kept in the high voltage, and the bit line Bit is held in the low voltage (FIG. 7H).

At a time t5, the voltage of the word line WL is decreased (FIG. 7A), and the voltage of the pre-charge line PDL is set to the high state (FIG. 7B), and the sensing operation is ended. Since the bit line Bit and the bit line Bit/ are shorted, both of the bit lines Bit and Bit/ are pre-charged to (½)VDD (FIG. 7H). At this time, the bit line Bit/ is in the VDD, and the bit line Bit is in the GND. Thus, the pre-charge voltage does not exceed (½)VDD, and the pre-charging operation can be properly performed.

According to the present invention, since the PMOS transistor Tr2 (Tr4) is over-driven to the side of the positive voltage, the amplification feedback in the circuit is sharply applied, which can increase the voltage difference between the bit lines Bit and Bit/. That is, the sense amplifier 3 can be operated at the high speed.

In the present invention, the switching to the usual power supply voltage VDD from the power supply voltage VSD1 for the over-drive is attained at a self-timing by using the sense amplifier dummy circuit 6 that can reproduce the operation of the sense amplifier 3. Thus, the switching can be performed at the optimal timing. In particular, the sense amplifier dummy circuit 6 provided in a local region (near the sense amplifier 3) for each sub array is used, which can attain the timing, in which the position dependence of the element characteristics in the semiconductor chip is considered.

Second Embodiment

In the second embodiment, both of the over-drive to the negative voltage side of the NMOS transistor and the over-drive to the positive voltage side of the PMOS transistor are performed.

Figure 8:
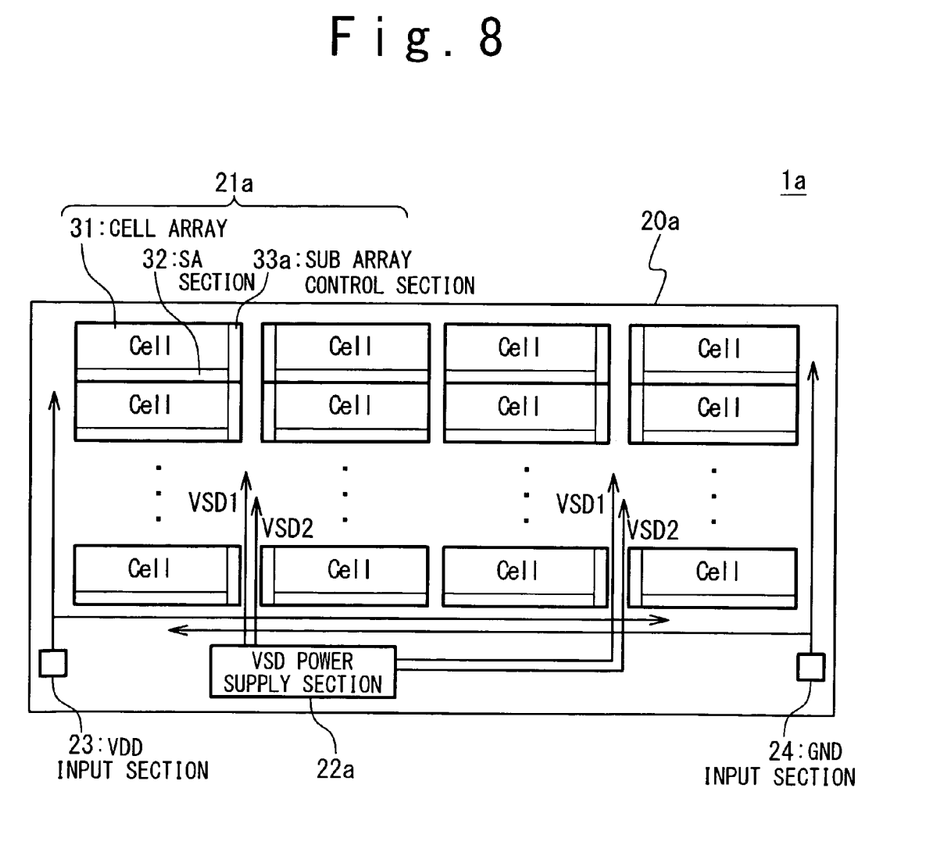
FIG. 8 is a block diagram showing a second embodiment of the semiconductor device of the present invention.

FIG. 8 is a block diagram showing of the semiconductor device according to the second embodiment of the present invention. A semiconductor device 1a contains the memory core 20. Here, the semiconductor device is sufficient to have a memory core 20a. The semiconductor device 1a may be a semiconductor memory device such as the DRAM or may be the system LSI having the memory core. The memory core 20a has a function of the memory and is exemplified by the DRAM core. However, when the read operation is performed by using the sense amplifier, the semiconductor device 1a is not limited to the DRAM core. This memory core 20a differs from the memory core 20 in the first embodiment, in that the memory core 20a has a VSD power supply section 22a and a sub array core 21a, instead of the VSD power supply section 22 and the sub array core 21.

The VSD power supply section 22a uses the power supply voltage VDD and the ground voltage GND and adds to the power supply voltage VSD1 higher than the power supply voltage VDD for the over-drive and then generates a (negative) power supply voltage VSD2 lower than the ground voltage GND. The sub array core 21a differs from the sub array core 21 in the first embodiment, in that this has a sub array control section 33a, instead of the sub array control section 33. The sub array control section 33a will be described later.

Since other configurations are similar to that of the first embodiment, their explanations are omitted.

Figure 9:
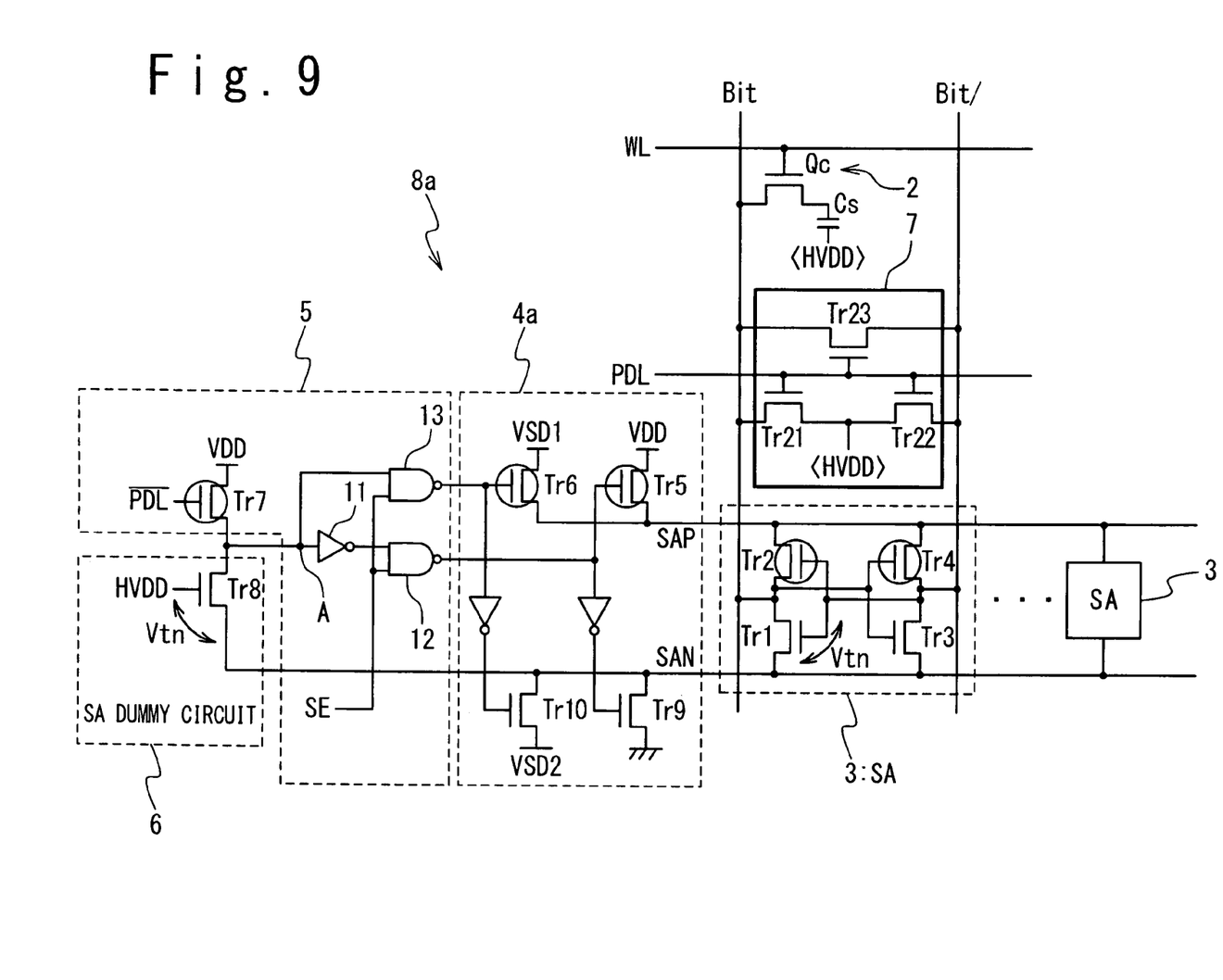
FIG. 9 is one example of the circuit diagram indicating the details of the sense amplifier in a sub array core 21a in the second embodiment of the present invention and the circuits with regard to it.

FIG. 9 is a circuit diagram showing the sense amplifier in the sub array core 21a in the second embodiment of the present invention and the circuits related to it. The sub array control section 33a in the sub array core 21a differs from the first embodiment in that the sub array control section 33a has a power supply circuit 4a, instead of the power supply circuit 4.

The power supply circuit 4a supplies the power supply voltage VSD1 (for example, 1.0 V) for the over-drive to the sense amplifier power supply line SAP at the time of the read operation in response to a control signal from the power supply control circuit 5 and then supplies the usual power supply voltage VDD (for example, 0.8 V). Simultaneously, the power supply circuit 4a supplies the power supply voltage VSD2 (for example, −0.2 V) for the over-drive to the sense amplifier power supply line SAN and then supplies the usual ground voltage GND (for example, 0 V).

The power supply circuit 4a has PMOS transistors Tr5 and Tr6 on the side of the sense amplifier power supply line SAP. In the PMOS transistor Tr5, its source is connected to a wiring to supply the power supply voltage VDD, its gate is connected to the power supply control circuit 5, and its drain is connected to the sense amplifier power supply line SAP. In the PMOS transistor Tr6, its source is connected to the wiring to supply the power supply voltage VSD1, its gate is connected to the power supply control circuit 5, and its drain is connected to the sense amplifier power supply line SAP.

The power supply circuit 4a contains NMOS transistors Tr9 and Tr10 on the side of the sense amplifier power supply line SAP. In the NMOS transistor Tr9, its source is connected to a wiring to supply the ground voltage GND, its gate is connected through an inverter circuit 14 to the NAND circuit 12 in the power supply control circuit 5, and its drain is connected to the sense amplifier power supply line SAN. I the NMOS transistor Tr10, its source is connected to the wiring to supply the power supply voltage VSD2, its gate is connected through an inverter circuit 15 to the NAND circuit 13 in the power supply control circuit 5, and its drain is connected to the sense amplifier power supply line SAN.

Since the other portion of the configuration is similar to that of the first embodiment, the explanation is omitted.

Figure 10A:
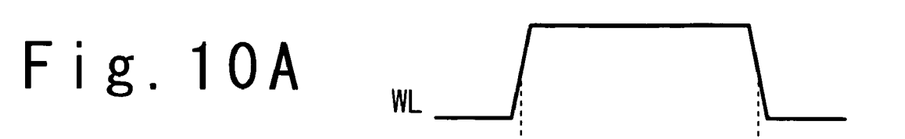
FIGS. 10A to 10H are timing charts showing the operation of the second embodiment in the semiconductor device of the present invention.
Figure 10B:
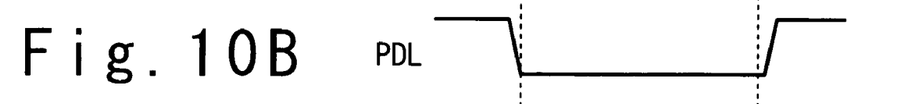
Figure 10C:
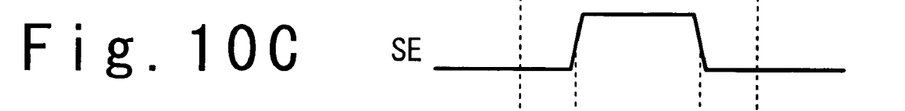
Figure 10D:
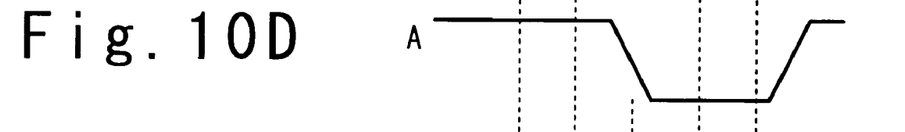
Figure 10E:
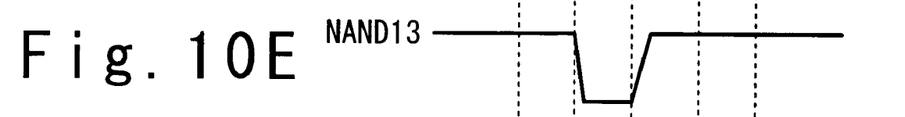
Figure 10F:
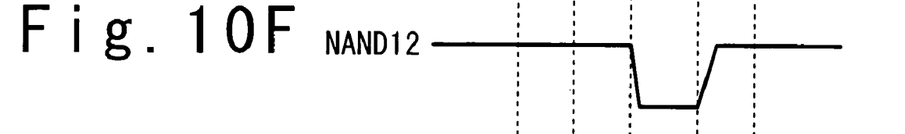
Figure 10G:
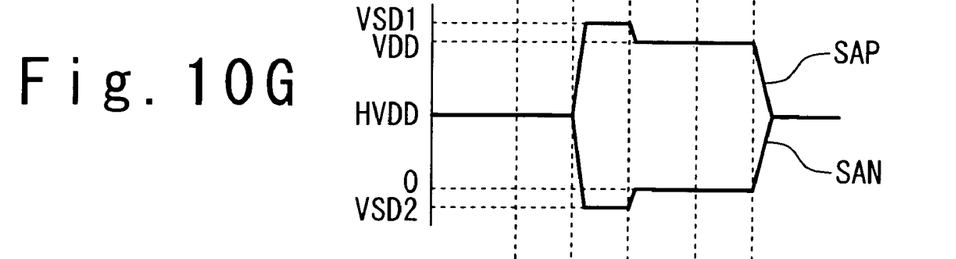
Figure 10H:
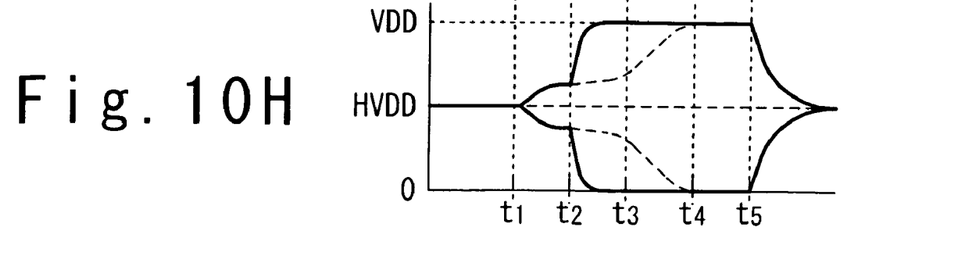

The operation of the semiconductor device according to the second embodiment of the present invention will be described below. FIGS. 10A to 10H are timing charts showing the operation of the semiconductor device in the second embodiment of the present invention. Here, FIG. 10A shows a voltage signal to boost up the word line WL, and FIG. 10B shows a voltage signal of the pre-charge line PDL. FIG. 10C shows a sense amplifier enable signal SE, and FIG. 10D shows a voltage signal of the node A. The node A is a connection point between the drain of the NMOS transistor Tr8 in the sense amplifier dummy circuit 6, the drain of the PMOS transistor Tr7 in the power supply control circuit 5, the input of the inverter circuit 11, and one input of the NAND circuit 13. FIG. 10E shows an output signal of the NAND circuit 13, and FIG. 10F shows an output signal of the NAND circuit 12. FIG. 10G shows voltage signals of the sense amplifier power supply lines SAP and SAN. FIG. 10H shows voltage signals on the bit lines Bit and Bit/.

At a time t1, the voltage signal on the pre-charge line PDL is set to the low state (FIG. 10B), the word line WL is boosted up (FIG. 10A), and the sensing operation is started. Thus, the voltage difference is generated between the bit lines Bit and Bit/ (FIG. 10H). Here, it is supposed that the high voltage side is the bit line Bit/, and the low voltage side is the bit line Bit. The sense amplifier enable signal SE is in the low state (FIG. 10C). Also, the PMOS transistor Tr7 in the power supply control circuit 5 is turned off, because the PDL/ signal is set to the high state. At this time, the voltage on the node A is the power supply voltage VDD (high state) (FIG. 10D). Thus, since the output of the NAND circuit 13 is in the high state (FIG. 10E), the PMOS transistor Tr6 is in the off state, and the NMOS transistor Tr10 is also in the off state. On the other hand, since the output of the NAND circuit 12 is in the high state (FIG. 10F), the PMOS transistor Tr5 is in the off state, and the NMOS transistor Tr9 is also in the off state. As a result, both of the power supply voltages VSD1 and VDD are not supplied to the sense amplifier power supply line SAP, and both of the power supply voltage VSD2 and the ground voltage GND are not supplied to the sense amplifier power supply line SAN. Therefore, both the voltages are in the HVDD state (FIG. 10G).

At a time t2, the sense amplifier enable signal SE is set to the high state (FIG. 10C). The PMOS transistor Tr7 in the power supply control circuit 5 is in the off state. At this time, the voltage on the node A is the power supply voltage VDD (the high state) (FIG. 10D). Thus, since the output of the NAND circuit 13 is set to the low state (FIG. 10E), the PMOS transistor Tr6 is turned on, and the NMOS transistor Tr10 is also turned on. On the other hand, since the output of the NAND circuit 12 is still in the high state (FIG. 10F), the PMOS transistor Tr5 is still off, and the NMOS transistor Tr9 is still off. As a result, the power supply voltage VSD1 is supplied to the sense amplifier power supply line SAP, and the power supply voltage VSD2 is supplied to the sense amplifier power supply line SAN (FIG. 10G).

The power supply voltage VSD1 and the power supply voltage VSD2 are supplied to the sense amplifier power supply lines SAP and SAN. Thus, through the operation of the sense amplifier SA, any one of the bit lines Bit and Bit/ begins to be rapidly changed to the high voltage, and the other begins to be rapidly changed to the low voltage (FIG. 10H). At this time, at the initial time of the sensing operation, the power supply voltage VSD1 higher than the usual power supply voltage VDD is supplied to the side of the sense amplifier power supply line SAP (which is over-driven to the positive side). In addition, the power supply voltage VSD2 lower than the usual ground voltage GND is also supplied to the side of the sense amplifier power supply line SAN (which is over-driven to the negative side). Therefore, as compared with a case of using the usual power supply voltage VDD and ground voltage GND (FIG. 10H: the dashed lines), the high voltage side (for example, the bit line Bit/) can be made to rise up at the high speed, and the low voltage side (for example, the bit line Bit) can be made to fall down at the high speed.

At a time t3, since the sense amplifier power supply line SAN is already in the power supply voltage VSD2, the voltage difference is generated between the sense amplifier power supply line SAN and the node A. Since the HVDD is already supplied to the gate of the NMOS transistor Tr8 in the sense amplifier dummy circuit 6, the charges are moved to the sense amplifier power supply line SAN from the node A. As a result, the voltage of the node A is decreased and is set to the low state (the ground voltage GND) (FIG. 10D).

Similarly, since the sense amplifier power supply line SAN is already in the negative power supply voltage VSD2, the voltage difference is generated between the sense amplifier power supply line SAN and the drain of the NMOS transistor Tr1. The gate of the NMOS transistor Tr1 in the sense amplifier 3 is already in the voltage higher than the HVDD. Thus, the NMOS transistor Tr1 is turned on, and the charges are moved from its drain to the sense amplifier power supply line SAN. As a result, the voltages of the drain and the bit line Bit are decreased to the ground voltage GND. The timing of the voltage decrease in the NMOS transistor Tr1 corresponds to the timing of the voltage decrease in the NMOS transistor Tr8. That is, the NMOS transistor Tr1 can reproduce the operation immediately after the activation of the NMOS transistor Tr8 (the sense amplifier 3).

As a result, since the output of the NAND circuit 13 is set to the high state (FIG. 10E), the PMOS transistor Tr6 is turned off, and the NMOS transistor Tr10 is also turned off. On the other hand, since the output of the NAND circuit 12 is set to the low state (FIG. 10F), the PMOS transistor Tr5 is turned on, and the NMOS transistor Tr9 is also turned on. As a result, the power supply voltage VDD is supplied to the sense amplifier power supply line SAP, and the ground voltage GND is supplied to the sense amplifier power supply line SAN (FIG. 10G).

The bit line Bit/ is substantially at the VDD of the high voltage, and the bit line Bit is substantially at the GND of the low voltage (FIG. 10H). At this time, the voltage supplied to the sense amplifier power supply line SAP is switched from the power supply voltage VSD1 of the high voltage to the usual power supply voltage VDD. On the other hand, the voltage supplied to the sense amplifier power supply line SAN is switched from the power supply voltage VSD2 of the low voltage to the usual ground voltage GND. Since this timing is set proper, the source voltage of the PMOS transistor Tr4 in the sense amplifier 3 is never over-shot to the positive side, and the source voltage of the NMOS transistor Tr1 is never over-shot to the negative side. Thus, the bit line Bit/ does not have a high voltage above VDD. For this reason, after the sensing operation, the bit lines Bit and Bit/ do not exceed ($\frac{1}{2}$)VDD, and the pre-charging can be properly performed.

Between the time t3 and a time t4, after the completion of the read operation, the sense amplifier enable signal SE is set to the low state at the time t4 (FIG. 10C). The voltage of the node A is in the low state (the ground voltage GND) (FIG. 10D). Thus, the output of the NAND circuit 13 is in the high state (FIG. 10E), and the PMOS transistor Tr6 is in the off state, and the NMOS transistor Tr10 is also in the off state. On the other hand, since the output of the NAND circuit 12 is set to the high state (FIG. 10F), the PMOS transistor Tr5 is turned off, and the NMOS transistor Tr9 is also turned off. As a result, the power supply voltage VDD and the ground voltage GND are not supplied to the sense amplifier power supply lines SAP and SAN. However, their voltages are kept (FIG. 10G). Also, the bit line Bit/ is kept at the high voltage, and the bit line Bit is kept at the low voltage (FIG. 10H).

At a time t5, the voltage of the word line WL is decreased (FIG. 10A), and the voltage of the pre-charge line PDL is set to the high state (FIG. 10B), and the sensing operation is ended. Since the bit line Bit and the bit line Bit/ are shorted, both of the bit lines Bit and Bit/ are pre-charged to ($\frac{1}{2}$)VDD. (FIG. 10H). At this time, the bit line Bit/ is at the VDD, and the bit line Bit is at the GND. Thus, the pre-charge voltage does not exceed ($\frac{1}{2}$)VDD, which enables the pre-charging to be properly performed.

According to the present invention, the PMOS transistor Tr2 (Tr4) is over-driven to the side of the positive voltage, and the NMOS transistor Tr3 (Tr1) is over-driven to the side of the negative voltage. Thus, the amplification feedback in the circuit is further rapidly applied, which can increase the voltage difference between the bit lines Bit and Bit/. That is, the sense amplifier 3 can be operated at the high speed.

In the present invention, the switching to the usual power supply voltage VDD from the power supply voltage VSD1 for the over-drive and the switching to the usual ground voltage GND from the power supply voltage VSD2 for the over-drive are attained at the self-timing by using the sense amplifier dummy circuit 6 that can reproduce the operation of the sense amplifier 3. Thus, the switching can be performed at the optimal timing. In particular, the sense amplifier dummy circuit 6 installed at the local region (near the sense amplifier 3) for each sub array is used, which can attain the timing, in which the position dependence of the element characteristics in the semiconductor chip is considered.

Figure 11:
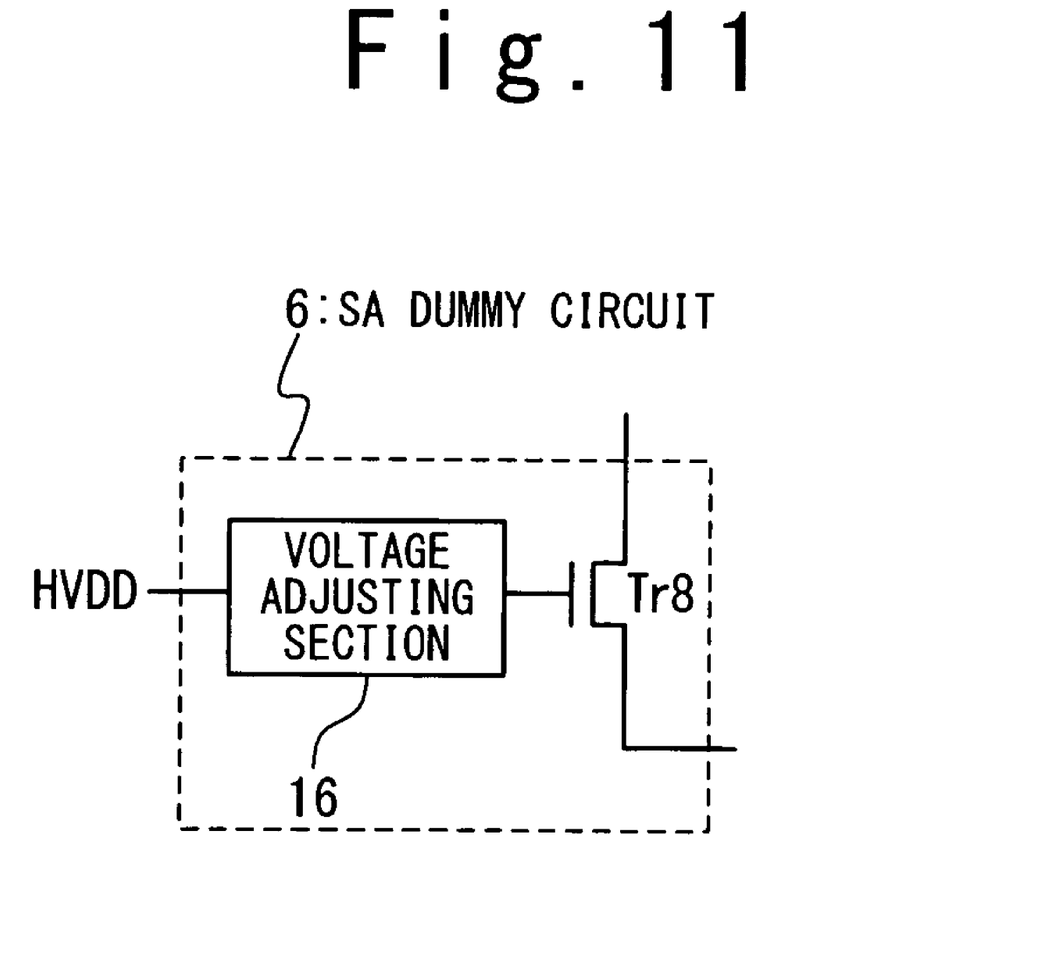
FIG. 11 is a block diagram showing one example of another embodiment of a sense amplifier dummy circuit.

In the above-mentioned first and second embodiments, the timing of the change (charge movement) in the voltage of the node A is important in reproducing the operation immediately after the activation of the sense amplifier 3 in the sense amplifier dummy circuit 6. The NMOS transistor Tr1 (Tr3) in the sense amplifier 3 and the NMOS transistor Tr8 in the sense amplifier dummy circuit 6 are same in configuration and provided at the positions close to each other. Thus, it is considered that there is no difference between the element performances, which is caused by the manufacture yields. However, in order to strictly reproduce the operation immediately after the activation of the sense amplifier 3, it is preferred to be able to adjust the operational difference between both the elements, which is caused by the slight difference between the element performances. FIG. 11 is a block diagram showing one example of the configuration of the sense amplifier dummy circuit. As shown in FIG. 11, for example, a voltage adjuster 16 is provided to finely adjust the gate voltage of the NMOS transistor Tr8 in the sense amplifier dummy circuit 6 from the HVDD so that the operational difference between the elements, which is caused by a slight difference between the element performances, can be finely adjusted. For example, when the HVDD of the gate voltage is made high, it is easy that the charges flow through the transistor Tr8. Thus, the voltage decreases of the node A before and after the time t3 is made faster. In this way, it is possible to reduce the application time of the power supply voltage VSD1 (VSD2). Oppositely, when the HVDD of the gate voltage is made low, it is difficult that the charges flow through the NMOS transistor Tr8. Thus, the voltage decrease of the node A before and after the time t3 is made slower. Therefore, it is possible to extend the application time of the power supply voltage VSD1 (VSD2).

In the second embodiment, both of the over-driving to the negative voltage side of the NMOS transistor and the over-driving to the positive voltage side of the PMOS transistor are performed. However, as mentioned above, only the over-driving to the negative voltage side of the NMOS transistor may be performed. In that case, in FIG. 9, for example, the PMOS transistor Tr6 may be removed, an inversion signal of the sense amplifier enable signal SE may be supplied to the gate of the power supply control circuit 5, and the power supply voltage VDD may be supplied through the PMOS transistor Tr5 to the sense amplifier power supply line SAP. Consequently, the NMOS transistor Tr1 (Tr3) in the sense amplifier 3 is over-driven, and the amplification feedback in the circuit is rapidly applied, which can increase the voltage difference between the bit lines Bit and Bit/. That is, the sense amplifier 3 can be operated at the high speed.

It would be clear that the present invention is not limited to the above-mentioned embodiments and that the embodiments may be suitably varied or modified within the range of the technical idea of the present invention.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device, comprising:
   a DRAM (dynamic random access memory) cell configured to store a data;
   a sense amplifier activated in response to a supply of power supply voltages and configured to sense the data stored in said DRAM cell;
   a power supply circuit configured to supply said power supply voltages to said sense amplifier;
   a sense amplifier dummy circuit configured to provide a replica of a state of said sense amplifier immediately after an activation of said sense amplifier; and
   a power supply control circuit configured to control said power supply circuit based on the replica, such that said power supply voltages are varied with time.

2. The semiconductor device according to claim 1, wherein said sense amplifier dummy circuit is arranged in a peripheral area of a sub array of a plurality of said DRAM cells.

3. The semiconductor device according to claim 2, wherein said semiconductor device comprises a memory array of a plurality of said sub arrays, and
   said sense amplifier dummy circuit is arranged for each of said plurality of sub arrays.

4. The semiconductor device according to claim 1, wherein said power supply control circuit controls said power supply circuit such that said power supply circuit supplies said sense amplifier with third and second voltages as said power supply voltages, and then supplies a first voltage lower than the third voltage in place of the third voltage.

5. The semiconductor device according to claim 1, wherein said power supply control circuit controls said power supply circuit such that said power supply circuit supplies said sense amplifier with first and fourth voltages as said power supply voltages, and then supplies a second voltage higher than the fourth voltage in place of the fourth voltage.

6. The semiconductor device according to claim 1, wherein said power supply control circuit controls said power supply circuit such that said power supply circuit supplies said sense amplifier with third and fourth voltages as said power supply voltages, and then supplies a first voltage lower than the third voltage in place of the third voltage, and a second voltage higher than the fourth voltage in place of the fourth voltage.

7. The semiconductor device according to claim 1, wherein said sense amplifier dummy circuit comprises a transistor whose source is connected with a lower side of said power supply voltages, and whose gate is connected with a half voltage equal to a half of the first voltage.

8. The semiconductor device according to claim 7, wherein said sense amplifier dummy circuit further comprises:
   a voltage adjusting circuit provided between the half voltage and said transistor and configured to adjust a gate voltage of said transistor based on the half voltage.

9. A semiconductor device comprising:
   a DRAM cell configured to store a data;
   a sense amplifier configured to sense the data read from said DRAM cell;
   first and second power supply lines connected to said sense amplifier;
   a switch circuit;
   a logic circuit configured to control said switch circuit to supply said first power supply line with one of a first voltage and a second voltage which is higher than the first voltage; and a sense amplifier dummy circuit directly connected with said second power supply line and configured to control said logic circuit.

10. The semiconductor device according to claim 9, wherein said sense amplifier dummy circuit comprises a dummy of a part of said sense amplifier.

11. The semiconductor device according to claim 10, wherein said sense amplifier dummy circuit represents an operation of said sense amplifier during a time period from a start of a precharging operation to a completion of a sensing operation.

12. A semiconductor device comprising:
a DRAM (dynamic random access memory) cell;
bit lines connected with said DRAM cell;
a sense amplifier comprising a first transistor connected to the bit lines to sense data stored in the DRAM cell; and
a sense amplifier dummy circuit comprising a second transistor and lacking dummy bit lines to provide a replica of a partial state of the sense amplifier.

13. The semiconductor device according to claim 12, further comprising:
first and second power supply lines connected to said sense amplifier circuit;
a power supply circuit configured to supply power supply voltages onto said first and second power supply lines; and
a power supply control circuit configured to control said power supply circuit such that said power supply circuit supplies said sense amplifier with third and second voltages as said power supply voltages, and then supplies a first voltage lower than the third voltage in place of the third voltage.

14. The semiconductor device according to claim 12, further comprising:
first and second power supply lines connected to said sense amplifier circuit;
a power supply circuit configured to supply power supply voltages onto said first and second power supply lines; and
a power supply control circuit configured to control said power supply circuit such that said power supply circuit supplies said sense amplifier with first and fourth voltages as said power supply voltages, and then supplies a second voltage higher than the fourth voltage in place of the fourth voltage.

15. The semiconductor device according to claim 12, further comprising:
first and second power supply lines connected to said sense amplifier circuit;
a power supply circuit configured to supply power supply voltages onto said first and second power supply lines; and
a power supply control circuit configured to control said power supply circuit such that said power supply circuit supplies said sense amplifier with third and fourth voltages as said power supply voltages, and then supplies a first voltage lower than the third voltage in place of the third voltage, and a second voltage higher than the fourth voltage in place of the fourth voltage.

16. The semiconductor device according to claim 12, wherein a source of said second transistor is connected with a lower side of said power supply voltages, and a gate thereof is connected with a half voltage equal to a half of the first voltage.

17. The semiconductor device according to claim 16, wherein said sense amplifier dummy circuit further comprises:
a voltage adjusting circuit provided between the half voltage and said transistor and configured to adjust a gate voltage of said transistor based on the half voltage.

18. The semiconductor device according to claim 12, further comprising a power supply control circuit configured to control a power supply providing power to power supply lines connected to said sense amplifier, based on the dummy sense amplifier, such that said power supply voltages are varied with time.

19. The semiconductor device according to claim 12, further comprising a power supply control circuit configured to control a power supply circuit providing power to said sense amplifier circuit, such that said power supply circuit supplies said sense amplifier with third and second voltages as said power supply voltages, and then supplies a first voltage lower than the third voltage in place of the third voltage.

20. The semiconductor device according to claim 12, wherein the sense amplifier dummy circuit is configured without the dummy bit lines to provide the replica of a partial state of the sense amplifier limiting to an operation immediately after an activation of the sense amplifier.

* * * * *